United States Patent
Su

(10) Patent No.: US 11,646,355 B2
(45) Date of Patent: May 9, 2023

(54) SHIELDED GATE TRENCH SEMICONDUCTOR APPARATUS AND MANUFACTURING METHOD THEREOF

(71) Applicant: Nanjing Zizhu Microelectronics Co., Ltd., Jiangsu (CN)

(72) Inventor: Yi Su, Cupertino, CA (US)

(73) Assignee: HUAYI MICROELECTRONICS CO., LTD., Xiamen (CN)

( * ) Notice: Subject to any disclaimer, the term of this patent is extended or adjusted under 35 U.S.C. 154(b) by 39 days.

(21) Appl. No.: 17/146,353

(22) Filed: Jan. 11, 2021

(65) Prior Publication Data
US 2022/0223708 A1 Jul. 14, 2022

(51) Int. Cl.
*H01L 29/49* (2006.01)
*H01L 29/06* (2006.01)
*H01L 29/423* (2006.01)

(52) U.S. Cl.
CPC ...... *H01L 29/4941* (2013.01); *H01L 29/0623* (2013.01); *H01L 29/4236* (2013.01)

(58) Field of Classification Search
CPC ............ H01L 29/4941; H01L 29/0623; H01L 29/4236; H01L 29/7813; H01L 29/7825; H01L 29/66613–66628; H01L 29/42336; H01L 29/42352; H01L 29/42356; H01L 21/743; H01L 2027/11861
See application file for complete search history.

(56) References Cited

U.S. PATENT DOCUMENTS

| | | | | |
|---|---|---|---|---|
| 2016/0322469 A1* | 11/2016 | Bhalla | ................ | H01L 29/4236 |
| 2017/0162689 A1* | 6/2017 | Hu | ...................... | H01L 29/1095 |
| 2019/0273152 A1* | 9/2019 | Yilmaz | .............. | H01L 29/1095 |
| 2020/0044078 A1* | 2/2020 | Yilmaz | ............. | H01L 29/66719 |
| 2020/0303507 A1* | 9/2020 | Yilmaz | ............. | H01L 29/66348 |

* cited by examiner

*Primary Examiner* — Shahed Ahmed
(74) *Attorney, Agent, or Firm* — Dragon Sun Law Firm, PC; Nathaniel Perkins

(57) ABSTRACT

The present application provides a shielded gate trench (SGT) semiconductor apparatus and a manufacturing method thereof. The SGT semiconductor apparatus includes a heavily N-type doped semiconductor substrate; an N-type epitaxial layer formed on the semiconductor substrate; at least one trench structure formed on the epitaxial layer and accommodating at least one gate polysilicon layer, where the trench structure includes a shielding polysilicon layer and an inter-polysilicon oxide layer; a P-type doped body and an N-type doped source layer formed on the epitaxial layer; a contact region formed for the source and the shield polysilicon connected to a source metal and the gate polysilicon connected to a gate meal. The SGT semiconductor apparatus is surrounded by a shield polysilicon termination trench; the gate polysilicon connected to the gate metal bus line is made outside the active region across the shield polysilicon termination trench.

8 Claims, 8 Drawing Sheets

SHIELDED GATE TRENCH SEMICONDUCTOR APPARATUS AND MANUFACTURING METHOD THEREOF

CROSS-REFERENCE TO RELATED APPLICATION

This application claims priority from the Chinese patent application 201910202460.5 filed Mar. 11, 2019, the content of which is incorporated herein in the entirety by reference.

TECHNICAL FIELD

The present application relates to a semiconductor apparatus, and in particular, to a shielded gate trench (SGT) semiconductor apparatus and a manufacturing method thereof.

BACKGROUND

Nowadays, many electronic circuit designs have strict requirements on device performance parameters, such as switching performance and an on-resistance. Power metal oxide semiconductor (MOS) devices are commonly used in such circuits. Shielded gate trench metal-oxide-semiconductor field effect transistors (SGT MOSFETs) are power MOS devices with good high-frequency switching performance and a low on-resistance. The existing technologies for manufacturing SGT MOSFETs are usually complex and high in cost, and the relevant prior art is disclosed in, for example, U.S. Pat. No. 6,891,223, No. US2016/0064546A1, No. U.S. Pat. No. 9,252,265B2, No. US2004/0016963A1, U.S. Pat. Nos. 6,936,890B2, 8,487,372B1 and 8,772,865B2.

The MOSFET devices are used in many power switching applications, such as DC-DC converters. In a typical MOSFET, a gate electrode provides on-off control by applying an appropriate gate voltage. For example, in an N-type enhanced MOSFET, when a positive voltage applied to a gate exceeds its threshold voltage, a conductive N-type inversion layer (i.e., channel region) is formed in a P-body region. The inversion layer connects an N-type source region to an N-type drain region, and allows majority carriers between these regions to be conducted and become a turn-on state.

There is a type of MOSFET device in which a gate electrode is formed in a trench extending downward from a main surface of a semiconductor material such as silicon. The current in such a device is mainly vertical, so the device units can be packed more densely. If all other conditions are the same, this will increase the current carrying capacity and reduce the on-resistance of the device.

In some applications, high-frequency switching characteristics are important, and some design techniques have been used to reduce the capacitance effect, thereby improving the switching performance. For example, it has been previously known that an additional electrode is introduced below a gate electrode in a trench MOSFET device and connected to a source electrode or another bias source. The additional electrode is commonly referred to as a "shielding electrode" and is used to reduce the electric field at the mesa region between the trenches, and reduce gate charge for improving the switching performance. The shielding electrode has previously been used in planar MOSFET devices.

Although the shielding electrode improves device performance, there are still challenges in integrating it with other device structures more effectively. These challenges include avoiding additional mask steps, solving the problem of non-planar topography, and avoiding increasing excessive consumption of the chip area. In addition, these challenges affect costs and manufacturability. Besides, an opportunity to optimize the shielding electrode device is also provided.

Therefore, layout design and manufacturing methods that effectively integrate the shielding electrode structure with other device structures are needed to provide more optimized and reliable performance.

SUMMARY

To solve the foregoing technical problem, an objective of the present application is to provide an SGT semiconductor apparatus, including: a heavily N-type doped semiconductor substrate; an N-type doped epitaxial layer formed on the semiconductor substrate; at least one trench structure formed on the epitaxial layer and accommodating at least one gate polysilicon layer, where the trench structure includes a shielding polysilicon layer and an inter-polysilicon oxide layer; a back substrate deposited with a metal layer for the a drain electrode; a source contact is for connecting a source metal layer and p-type body region; a heavily N-type doped source region is formed on the top of the semiconductor surface; an LTO and a boron-phosphorosilicate glass (BPSG) oxide layer is arranged between the gate polysilicon layer and the source metal layer.

Another objective of the present application is to provide a method for manufacturing an SGT semiconductor apparatus. The method include the following steps: providing a heavily N-type doped semiconductor substrate; forming an N-type epitaxial layer on the semiconductor substrate; forming at least one trench structure on the epitaxial layer and accommodating at least one gate polysilicon layer by the trench structure, where the trench structure includes a shielding polysilicon layer and an inter-polysilicon oxide layer; forming a heavily doped source region at a semiconductor surface; and forming a source metal layer above the source region; where a BPSG oxide layer is arranged between the gate polysilicon layer and the source metal layer.

The objective of the present application and the solving of the technical problem are implemented by adopting the following technical solutions.

In an embodiment of the present application, the SGT semiconductor apparatus further includes a gate polysilicon contact to a gate metal bus line which is arranged at an outer edge of an active region, has a loose pitch to reduce parasitic output and input capacitances.

In an embodiment of the present application, the gate polysilicon contact to gate metal bus line may be disposed at an edge of the active region or an intermediate region of an edge.

In an embodiment of the present application, the gate polysilicon contact to gate metal bus line and a shielding polysilicon contact to source metal are arranged outside an edge of a termination region.

In an embodiment of the present application, a gap between the shielding polysilicon layer and the gate polysilicon layer is greater than 0.1 µm.

In an embodiment of the present application, a size of a gap between the gate polysilicon layer and a gate trench side wall in the gate polysilicon contact region is determined by a distance between an edge of the liner oxide layer and a gate trench sidewall; when the device breakdown voltage is less than or equal to 30 V, the gap can be 0.1 µm; and when the device breakdown voltage is greater than 30 V, the gap is large, such as 0.2 to 0.6 µm.

In an embodiment of the present application, the shielding polysilicon layer is arranged in a trench in a termination region or an outer edge of an active region or an intermediate region of an active region.

In an embodiment of the present application, the shielding polysilicon contact to source metal is located in the middle between the gate polysilicon contact and the gate metal layer bus line, an additional shielding polysilicon contact to source metal is arranged near the gate polysilicon contact to gate metal bus line to further reduce a resistance of the shielding polysilicon layer for improving switching performance.

In an embodiment of the present application, the method further includes: a width of a trench in a termination region being the same as or different from a width of a trench in an active region.

In the present application, a resistance of the gate polysilicon and a resistance of the shielding polysilicon can be reduced without increasing an output capacitance in an MOSFET. The method is suitable for a MOSFET device with a breakdown voltage from 15 V to 60 V.

DETAILED DESCRIPTION

Figure 1A:
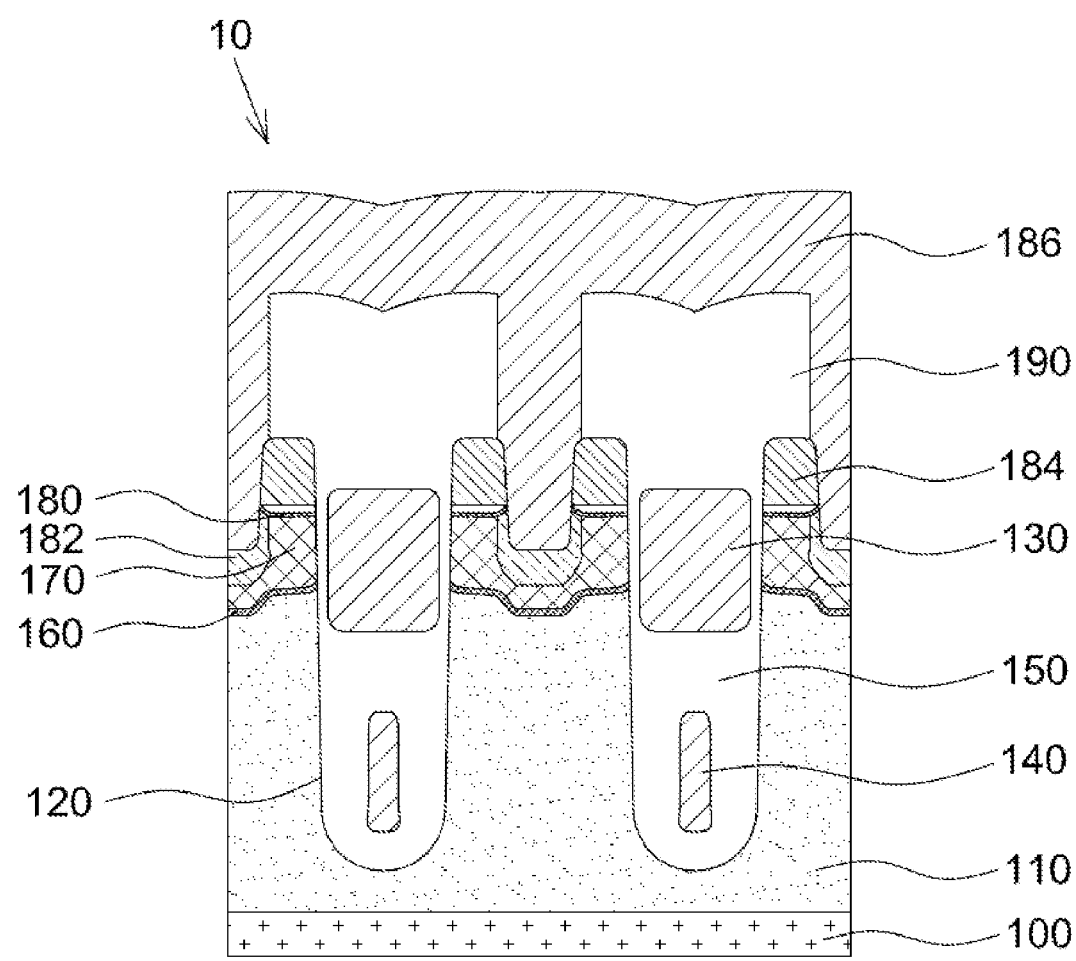
FIG. 1a is a schematic cross-sectional diagram of an SGT MOSFET according to an embodiment of the present application.

The following embodiments are described with reference to the accompanying drawings to illustrate, by way of examples, specific embodiments that the present application can implement. Directional terms mentioned in the present application, such as "upper", "lower", "front", "rear", "left", "right", "inner", "outer" and "side" only indicate the directions of the accompanying drawings. Therefore, the directional terms are intended to illustrate and help understand the present application, but not limit the present application.

The accompanying drawings and description are regarded as illustrative but not limitative in nature. In the drawings, elements with similar structures are denoted by the same reference numerals. In addition, for understanding and ease of description, the size and thickness of each component shown in the accompanying drawings are arbitrarily shown, but the present application is not limited thereto.

The following disclosure provides many different embodiments or instances in order to implement the features of provided targets. Specific instances of components, materials, values, steps, arrangements or similar aspects are described below to simplify the present disclosure. Certainly, such instances are only examples and are not intended to be limitative. Other components, materials, values, steps, arrangements or similar aspects are included. For example, forming a first feature above or on a second feature in the following description may include embodiments in which the first feature and the second feature are formed in direct contact, and may also include embodiments in which an additional feature may be formed between the first feature and the second feature so that the first feature and the second feature may not be in direct contact. In addition, the present disclosure may repeat component symbols and/or letters in each instance. This repetition is for brevity and clarity, and does not in itself indicate the relationship between the various embodiments and/or configurations discussed.

Further, for ease of description, spatial relativity terms such as "below", "under", "lower", "above", "upper" and similar terms may be used to describe the relationship between one component or feature illustrated in the figures and another component (or a plurality of components) or feature (or a plurality of features). In addition to the orientations depicted in the figures, spatial relativity terms are intended to include different orientations of apparatuses in use or operation. Devices can be oriented in other ways (rotated by 90° or in other orientations) and thus spatial relativity descriptors used herein can be interpreted as such.

To further illustrate the technical means and effects adopted by the present application to achieve the intended objectives of the present invention, the following describes in detail, with reference to the accompanying drawings and specific embodiments, specific implementations, structures, features and effects of an SGT semiconductor apparatus and a manufacturing method thereof according to the present application.

FIG. 1a is a schematic cross-sectional diagram of an SGT MOSFET according to an embodiment of the present application. Referring to FIG. 1a, in an embodiment of the present application, an SGT semiconductor apparatus 10 includes: a heavily N-type doped semiconductor substrate 100; an epitaxial layer 110 formed on the semiconductor substrate 100; at least one trench structure 120 formed on the epitaxial layer 110 and accommodating at least one gate polysilicon layer 130, where the trench structure 120 includes a shielding polysilicon layer 140 and an interpolysilicon oxide layer 150; a P-type doped junction 160 formed on the N-type epitaxial layer 110; a P-type doped body 170 formed above the P-type body junction region 160; a source contact region 180 which connects the source region 184 and the P-type body region 170 through a heavily P-type doped contact region 182; a source 184 formed above the P-type body 170; and a source metal layer 186 formed on the source region 180; where an LTO and a boron-phosphorosilicate glass (BPSG) oxide layer 190 is arranged between the gate polysilicon layer 130 and the source metal layer 186.

Figure 1B:
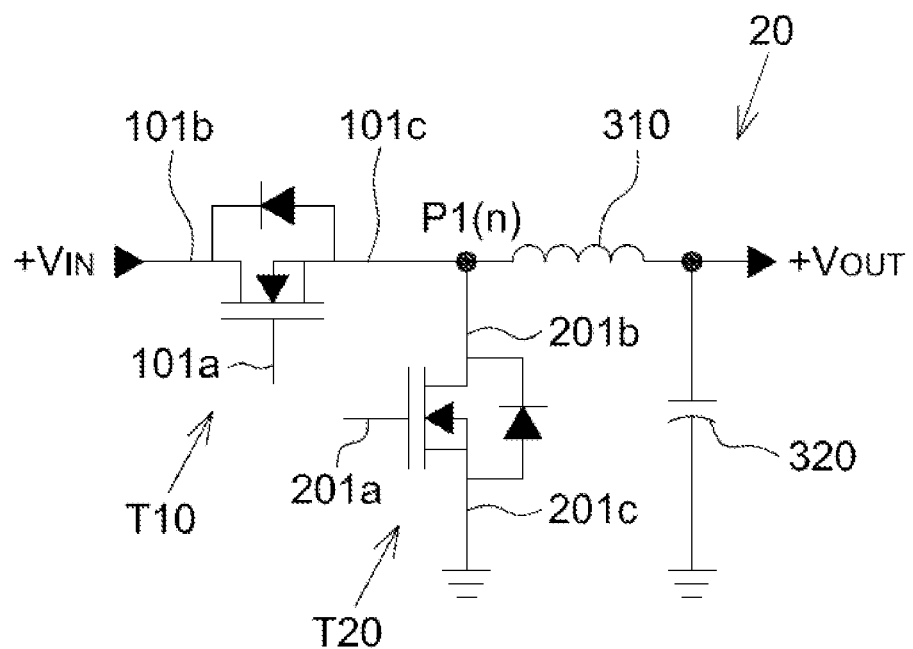
FIG. 1b is a schematic diagram of a converter circuit applied to the conversion of a DC voltage to a DC voltage according to an embodiment of the present application.

FIG. 1b is a schematic diagram of a converter circuit applied to the conversion of a DC voltage to a DC voltage according to an embodiment of the present application. Referring to FIG. 1a and FIG. 1b, in an embodiment of the present application, the converter circuit 20 applied to the conversion of a DC voltage to a DC voltage includes: a first switch T10, a second switch T20, an inductor 310, and a capacitor 320, where an electrode of a control end 101a of the first switch T10 receives a signal, an electrode of a first end 101b of the first switch T10 is coupled to an input voltage Vin, and an electrode of a second end 101c of the first switch T10 is coupled to a first node P1(n); an electrode of a control end 201a of the second switch T20 receives a signal, an electrode of a first end 201b of the second switch T20 is coupled to the first node P1(n), and an electrode of a second end 201c of the second switch T20 is grounded; an electrode at one end of the inductor 310 is coupled to the first node P1(n), and an electrode at the other end thereof is coupled to an output voltage Vout; and an electrode at one end of the capacitor 320 is grounded, and an electrode at the other end thereof is coupled to the output voltage Vout. The first switch T10 and the second switch T20 adopt the structure of the SGT semiconductor apparatus 10 of the present application, so it is necessary to reduce a gate resistance and a shielding polysilicon resistance to adapt to applications of high-frequency and high-efficiency exchangers.

Figure 2:
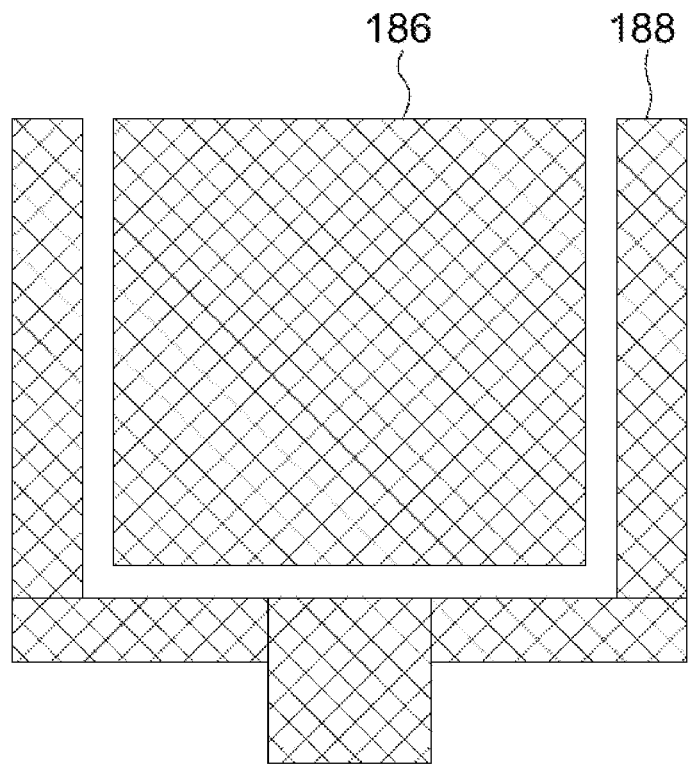
FIG. 2 is a top view with metal layers according to an embodiment of the present application.
Figure 3:
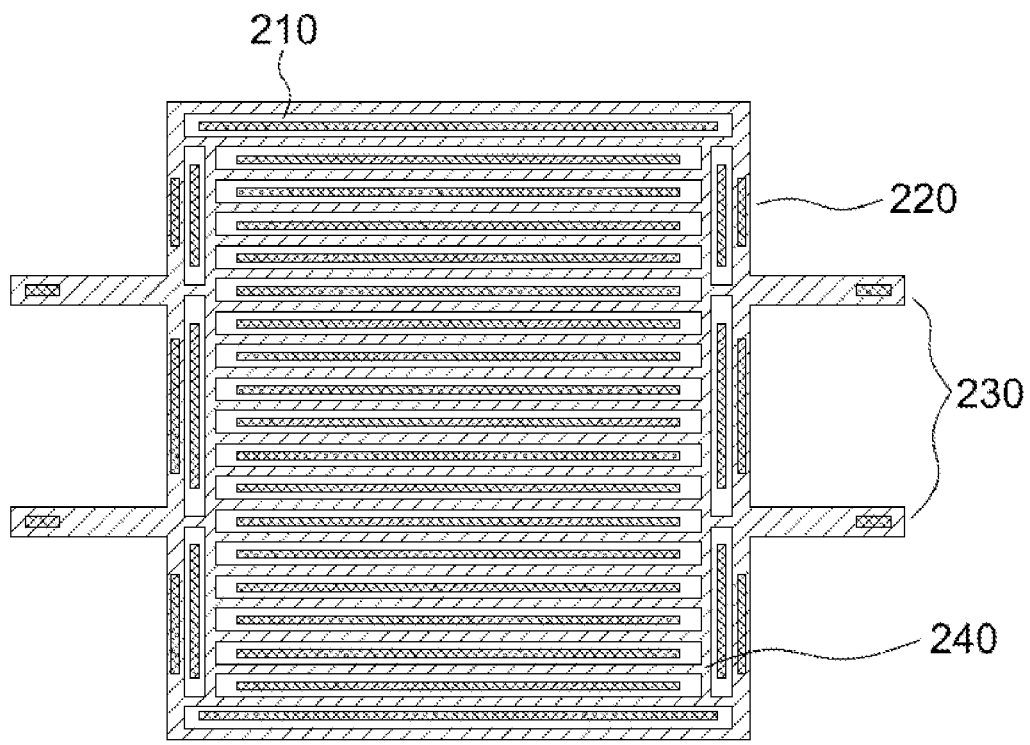
FIG. 3 is a top view with trenches and contact points according to an embodiment of the present application.
Figure 4:
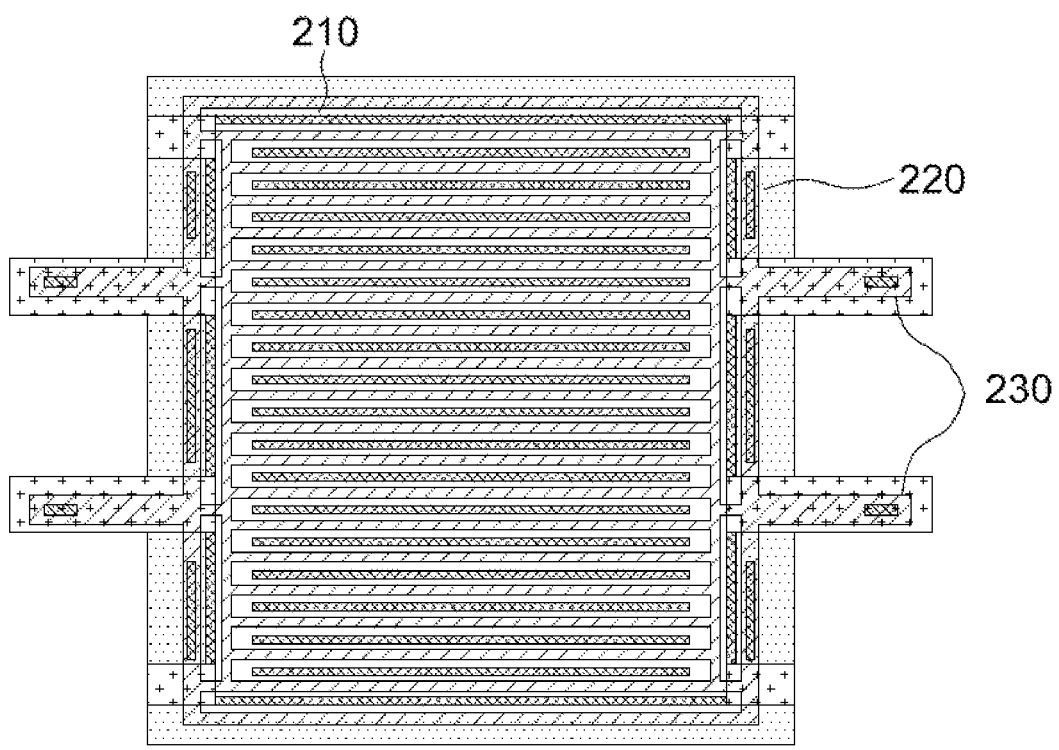
FIG. 4 is a top view with trenches, contact points, a shielding polysilicon layer and a polysilicon oxide layer according to an embodiment of the present application.
Figure 5:
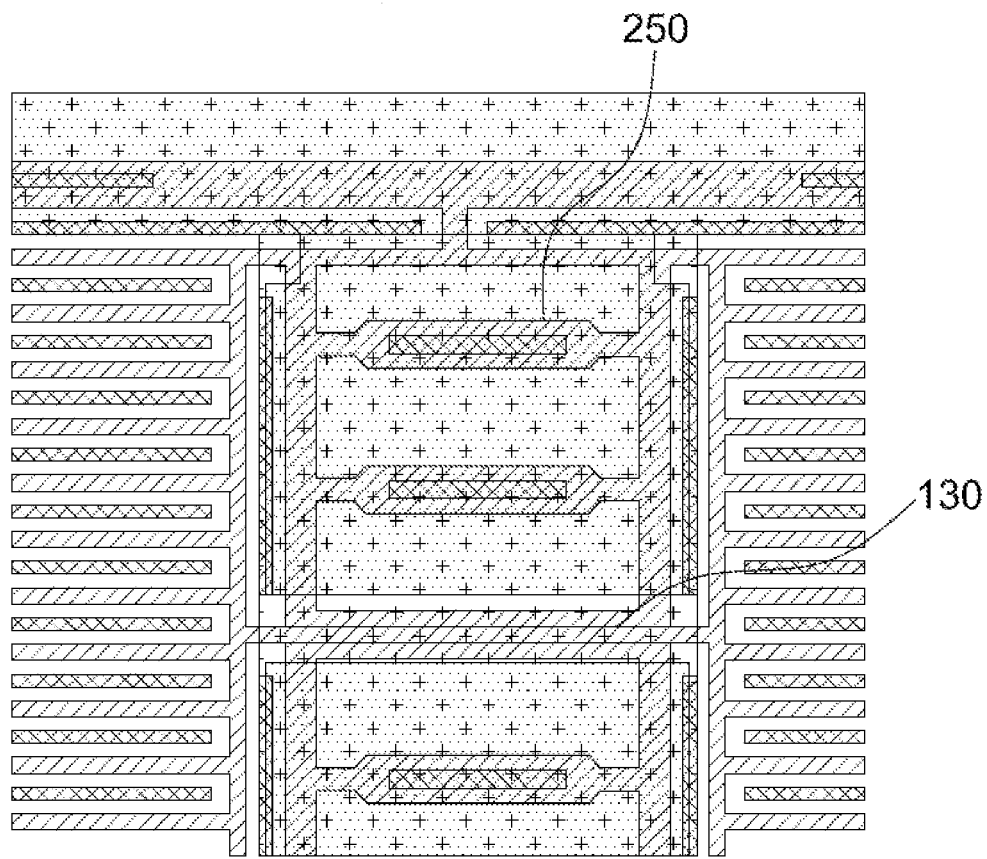
FIG. 5 is a schematic diagram with a shielding polysilicon contact pickup located in an intermediate region of an active region according to an embodiment of the present application.
Figure 6A:
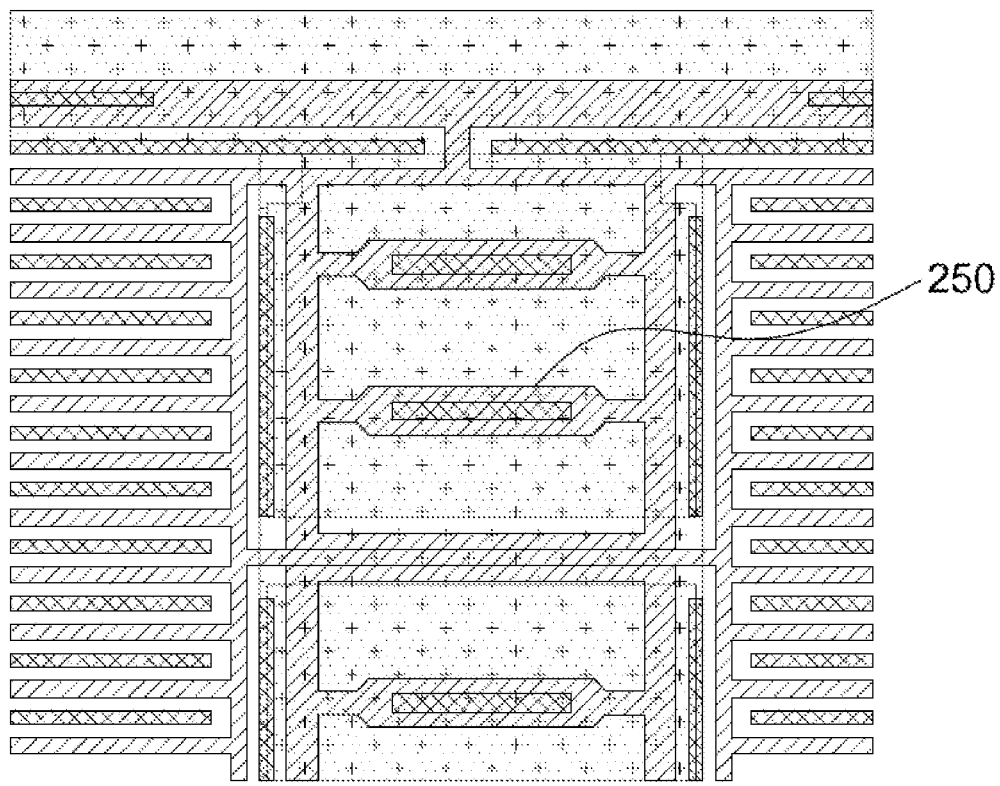
FIG. 6a is a top view with trenches, a shielding polysilicon contact pickup and contact points according to an embodiment of the present application.
Figure 6B:
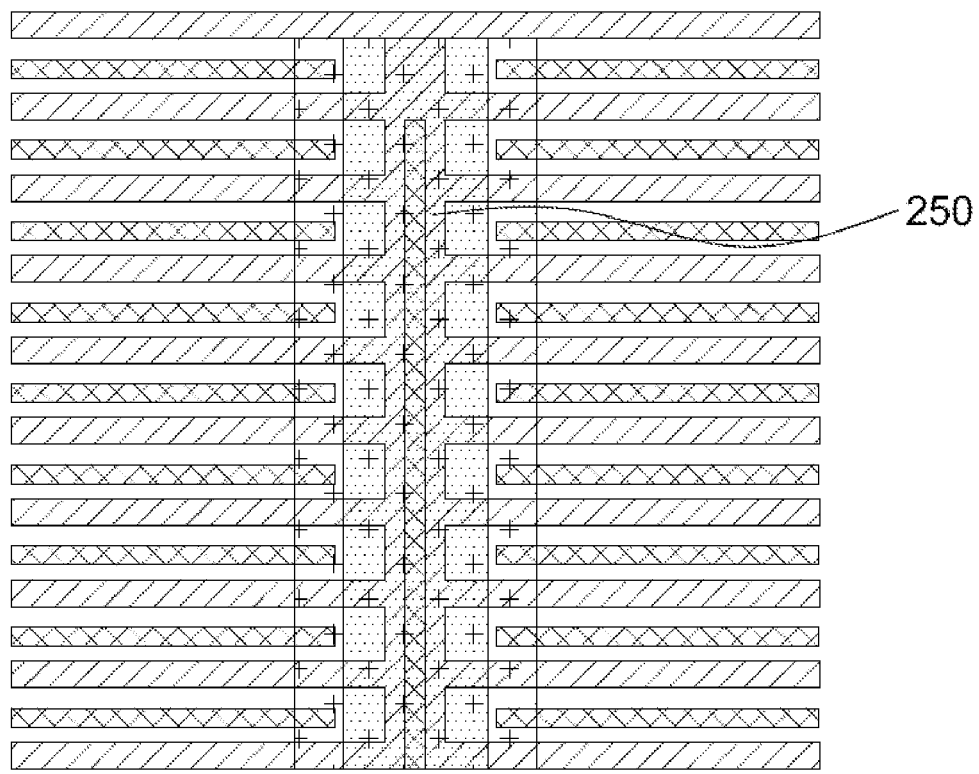
FIG. 6b is a top view with trenches, a shielding polysilicon contact pickup and contact points according to another embodiment of the present application.

FIG. 2 is a top view with a metal layer according to an embodiment of the present application; FIG. 3 is a top view with trenches and contact points according to an embodiment of the present application; FIG. 4 is a top view with trenches, contact points, a shielding polysilicon layer and a polysilicon oxide layer according to an embodiment of the present application; FIG. 5 is a schematic diagram with a shielding polysilicon contact located in an intermediate region of an active region according to an embodiment of the present application; FIG. 6a is a top view with trenches, a shielding polysilicon contact and contact points according to an embodiment of the present application; and FIG. 6b is a top view with trenches, a shielding polysilicon contact and contact points according to another embodiment of the present application. Referring to FIG. 1a and FIG. 2, in an embodiment of the present application, a metal layer layout includes a source metal layer 186 and a gate metal layer 188; and the gate metal layer 188 surrounds the source metal layer 186.

Referring to FIG. 1a, FIG. 2 and FIG. 3, in an embodiment of the present application, a trench and contact point layout includes a contact region 210 in which a source 184 is in contact with the source metal layer 186, a contact region 220 in which a shielding polysilicon layer 140 is in contact with the source metal layer 186, a contact region 230 in which a gate polysilicon layer 130 is in contact with the gate metal layer 188, and a trench region 240, in which a trench in a vertical direction is connected to a trench in a parallel direction by using the gate polysilicon layer 130.

Referring to FIG. 1a and FIG. 2 to FIG. 4, in an embodiment of the present application, a layout of trenches, contact points, a shielding polysilicon layer and an inter-polysilicon oxide layer includes a contact region 210 in which a source 184 is in contact with a source metal layer 186, a contact region 220 in which a shielding polysilicon layer 140 is in contact with a metal layer 186, and a contact region 230 in which a gate polysilicon layer 130 is in contact with a gate metal layer 188.

Referring to FIG. 1a and FIG. 2 to FIG. 5, in an embodiment of the present application, a layout with a shielding polysilicon contact located in an intermediate region of an active region includes a shielding polysilicon contact 250 and a gate polysilicon layer 130. The gate polysilicon layer 130 is configured to connect a left region with a right region.

Referring to FIG. 1a, FIG. 2 to FIG. 5, and FIG. 6a, in an embodiment of the present application, a layout with trenches, shielding polysilicon contacts and contact points includes shielding polysilicon contact 250 located outside an active region. The shielding polysilicon contact 250 are arranged in parallel.

Referring to FIG. 1a, FIG. 2 to FIG. 5, and FIG. 6b, in an embodiment of the present application, a layout with trenches, a shielding polysilicon contact and contact points includes a shielding polysilicon contact 250 located outside an active region. The shielding polysilicon contact 250 is perpendicular to the active region.

Figure 7A:
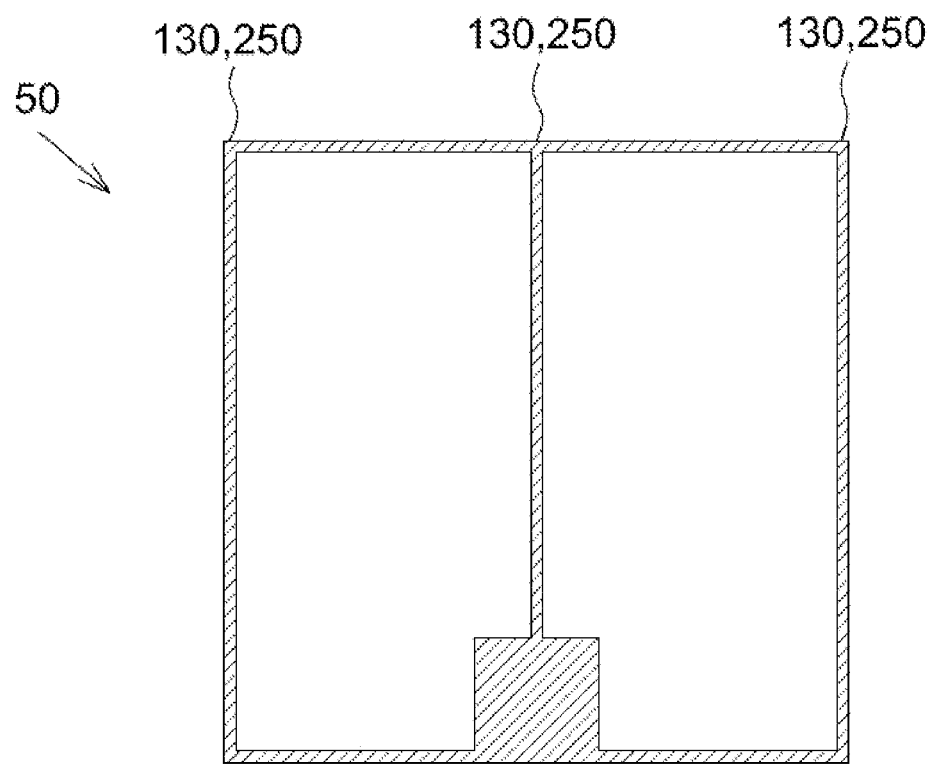
FIG. 7a is a top view with a gate polysilicon layer and shielding polysilicon contact pickups according to an embodiment of the present application.
Figure 7B:
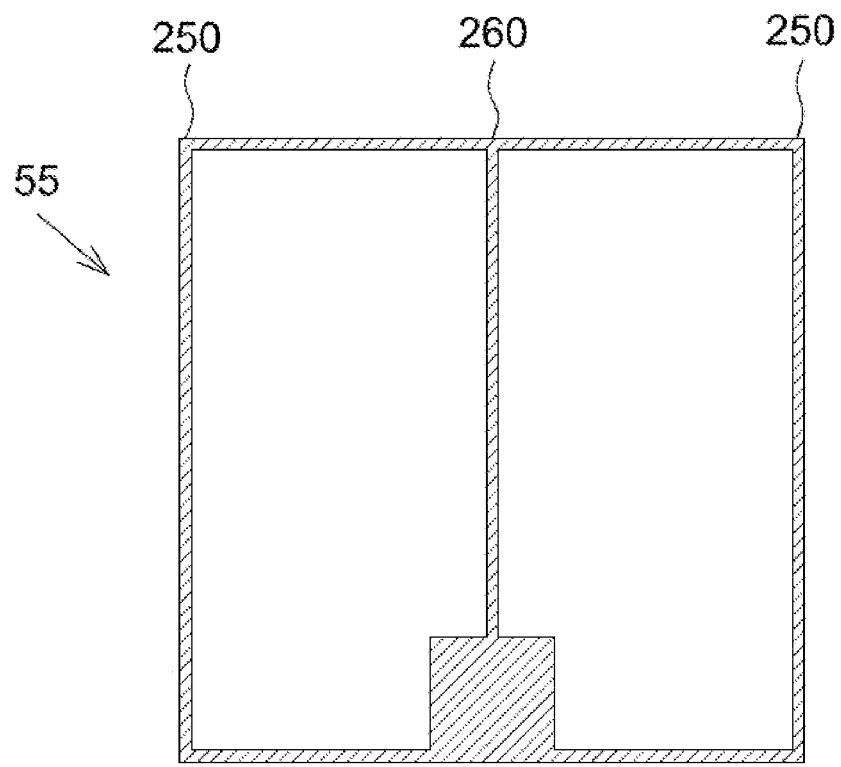
FIG. 7b is a top view with a gate polysilicon contact pickup and shielding polysilicon contact pickups according to another embodiment of the present application.

FIG. 7a is a top view with gate polysilicon layers and shielding polysilicon contacts according to an embodiment of the present application; and FIG. 7b is a top view with a gate polysilicon contact pickup and shielding polysilicon contact pickups according to another embodiment of the present application. Referring to FIG. 1a and FIG. 7a, in an embodiment of the present application, a layout mode 50 with gate polysilicon layers and shielding polysilicon contact pickups includes gate polysilicon layers 130 and shielding polysilicon contact pickups 250. The gate polysilicon layers 130 and the shielding polysilicon contact pickups 250 are respectively evenly arranged in three line segments.

Referring to FIG. 1a and FIG. 7b, in an embodiment of the present application, a layout mode 55 with a gate polysilicon contact pickup and shielding polysilicon contact pickups includes: a gate polysilicon contact pickup 260 and shielding polysilicon contact pickups 250. The gate polysilicon contact pickup 260 is arranged in the middle line segment, and the shielding polysilicon contact pickups 250 are evenly arranged in the left line segment and the right line segment respectively. A gate resistance and a shielding polysilicon resistance in the layout mode 50 with gate polysilicon layers and shielding polysilicon contact pickups are only 50% of those in the layout mode 55 with a gate polysilicon contact pickup and shielding polysilicon contact pickups. When the shielding polysilicon contact pickup is inserted between the gate polysilicon contact pickups, the shielding polysilicon resistance in the layout mode 50 is 25% of that in the layout mode 55.

Figure 8:
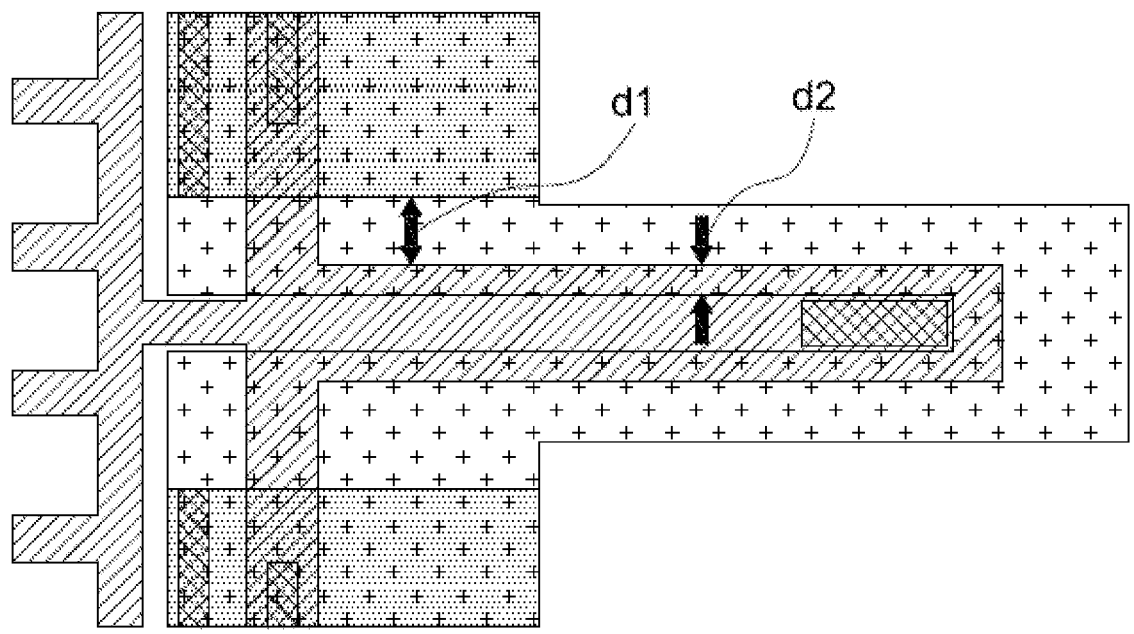
FIG. 8 is a schematic diagram with a gap d1 and a gap d2 according to an embodiment of the present application.

FIG. 8 is a schematic diagram with a gap d1 and a gap d2 according to an embodiment of the present application. Referring to FIG. 1a and FIG. 8, in an embodiment of the present application, a gap d1 between a shielding polysilicon layer 140 and an inter-polysilicon oxide layer 150 is determined by a gap between the shielding polysilicon layer 140 and a gate polysilicon layer 130. The shield polysilicon layer 140 is brought to the semiconductor surface by a shield poly mask layer. The inter-polysilicon oxide layer is brought to the semiconductor surface by an inter-polysilicon mask layer. The top surface distance d1 is determined by the shield polysilicon mask layer and the inter-polysilicon oxide mask layer.

Referring to FIG. 1a and FIG. 8, in an embodiment of the present application, a gap d2 between an edge of a gate trench 120, and an edge of the liner oxide layer should be able to withstand a breakdown voltage greater than that of the device.

In an embodiment of the present application, the SGT semiconductor apparatus further includes a gate polysilicon contact pickup 260 which, when arranged at an outer edge of an active region, has a loose distance dimension to reduce parasitic output and input capacitances.

In an embodiment of the present application, the gate polysilicon contact pickup 260 may be disposed at an edge of an active region or an intermediate region of an active region.

In an embodiment of the present application, the gate polysilicon contact pickup 260 and a shielding polysilicon contact pickup 250 are arranged outside an edge of a termination region.

In an embodiment of the present application, a gap between the shielding polysilicon layer 140 and the gate polysilicon layer 130 is greater than 0.1 μm.

In an embodiment of the present application, a gap between the gate polysilicon layer 130 and a gate trench 120 side wall in the gate polysilicon contact pickup 260 region is determined by a distance between a liner oxide layer and a gate trench 120; when the device breakdown voltage is less than or equal to 30 V, the gap is 0.1 μm; and when the device breakdown voltage is greater than 30 V, the gap is 0.2-0.6 μm.

In an embodiment of the present application, the shielding polysilicon layer 140 is arranged in a trench in a termination region or an outer edge of an active region or an intermediate region of an active region.

In an embodiment of the present application, the shielding polysilicon contact pickup 250 located in the middle includes a gate polysilicon layer 130 connected to and crossing a part of a shielding polysilicon contact pickup 250 region, so a plurality of shielding polysilicon contact pickups 250 are arranged between two gate polysilicon contact pickups 260 to further reduce a resistance of the shielding polysilicon layer 140.

In an embodiment of the present application, the SGT semiconductor apparatus 10 is suitable for applications of high-frequency switching.

In an embodiment of the present application, the SGT semiconductor apparatus 10 may be suitable for a MOSFET device with a breakdown voltage from 15 V to 60 V.

In an embodiment of the present application, the SGT semiconductor apparatus 10 may be suitable for applications of lower-frequency switching, and only a relatively small number of shielding polysilicon contact pickups 250 and the gate polysilicon contact pickup 260 are needed.

In an embodiment of the present application, the shielding polysilicon layer 140 reaches a silicon surface and surrounds a termination region of an edge.

In an embodiment of the present application, an edge of a trench in a termination region is provided with a thick liner oxide layer, which is suitable for devices of high voltage levels.

In an embodiment of the present application, an active region of a trench in a termination region is provided with a thin oxide layer, such as a gate oxide layer.

In an embodiment of the present application, a thick liner oxide layer in an active region of a trench in a termination region may affect a charge balance in a termination unit.

In an embodiment of the present application, the SGT semiconductor apparatus 10 may be applicable to N-type semiconductor apparatuses and P-type semiconductor apparatuses.

Figure 9:
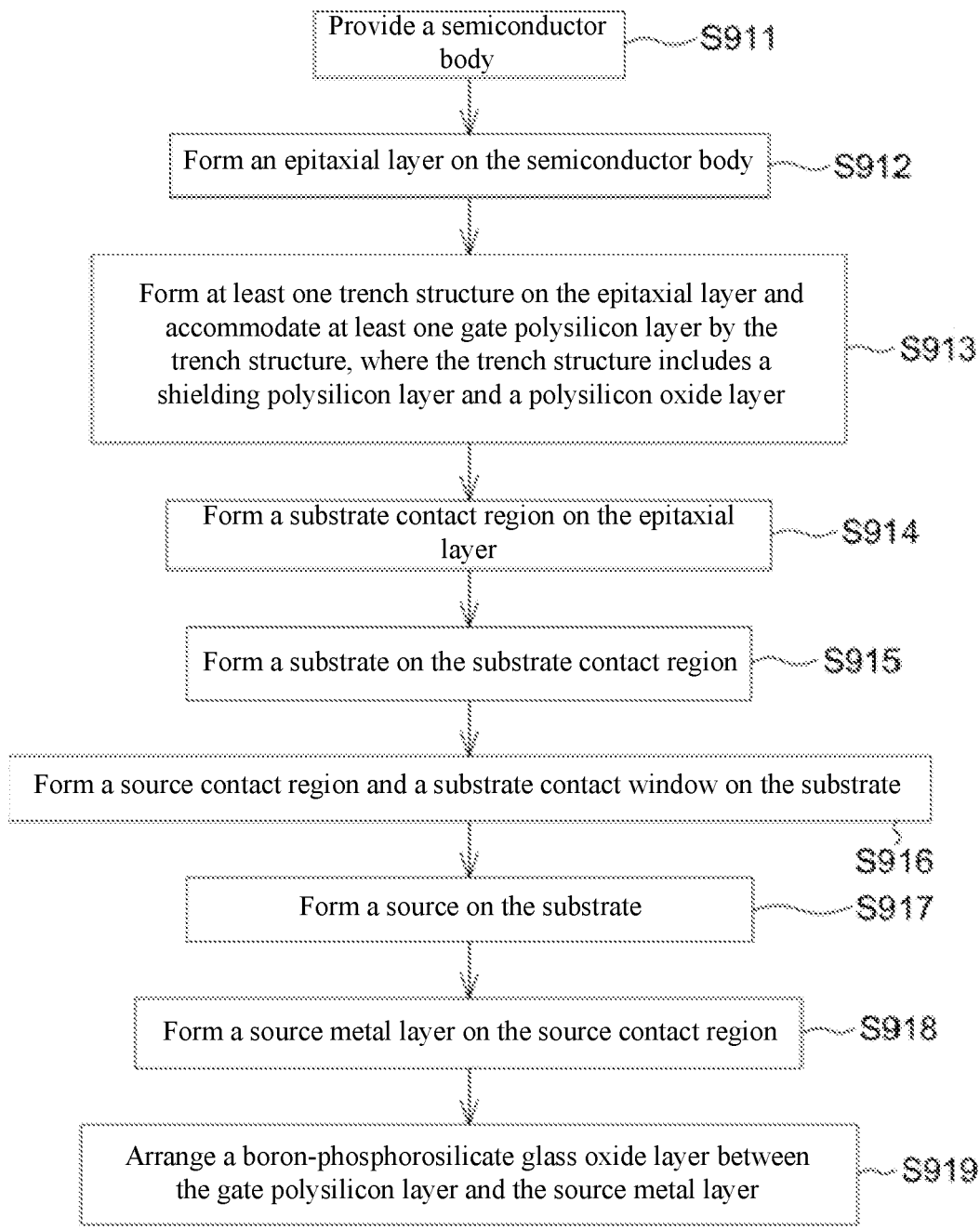
FIG. 9 is a flowchart of a method for manufacturing an SGT semiconductor apparatus according to an embodiment of the present application.

FIG. 9 is a flowchart of a method for manufacturing an SGT semiconductor apparatus according to an embodiment of the present application. Referring to FIG. 1a and FIG. 9, in an embodiment of the present application, a method for manufacturing an SGT semiconductor apparatus 10 includes the following steps: providing a heavily doped semiconductor substrate 100; forming an N-type epitaxial layer 110 on the semiconductor substrate 100; forming at least one trench structure 120 on the epitaxial layer 110 and accommodating at least one gate polysilicon layer 130 by the trench structure 120, where the trench structure 120 includes a shielding polysilicon layer 140 and an inter-polysilicon oxide layer 150; forming a P-type doped body region 170 on the epitaxial layer 110; forming a source contact region 180 and a heavily doped contact region 182 in the P-type body region 170; forming a heavily doped source 184 on the P-type body region 170; and forming a source metal layer 186 on the semiconductor surface; where a BPSG oxide layer 190 is arranged between the gate polysilicon layer 130 and the source metal layer 186.

In an embodiment of the present application, the method further includes: a width of a trench in a termination region being the same as or different from a width of a trench in an active region in the semiconductor apparatus 10.

Referring to FIG. 9, in step S911, a heavily N-type doped semiconductor substrate is provided.

Referring to FIG. 9, in step S912, an epitaxial layer is formed on the semiconductor substrate.

Referring to FIG. 9, in step S913, at least one trench structure is formed on the epitaxial layer and accommodates at least one gate polysilicon layer, where the trench structure includes a shielding polysilicon layer and an inter-polysilicon oxide layer.

Referring to FIG. 9, in step S914, a P-type doped body region is formed on the epitaxial layer.

Referring to FIG. 9, in step S915, a heavily doped source region is formed on the P-type body region.

Referring to FIG. 9, in step S916, a BPSG oxide layer is deposited on the semiconductor surface.

Referring to FIG. 9, in step S917, a contact window is opened on the semiconductor surface by removing the BPSG oxide layer at the contact region for the shield polysilicon contact, gate polysilicon contact, and P-type body contact at the active region. A heavily P-type implant is done at the contact region for improving ohmic contact.

Referring to FIG. 9, in step S918, finally, a metal layer is deposited on the semiconductor surface, and then patterned by a metal mask layer to for a source metal and gate metal layer.

In the present application, a resistance of the gate polysilicon and a resistance of the shielding polysilicon can be reduced without increasing an output capacitance in an MOSFET. The method is suitable for a device with a low voltage, such as a device with a voltage less than or equal to 30 V, or a device with a medium voltage, such as a MOSFET device with a voltage of 40 V to 60 V.

Terms such as "in some embodiments" and "in various embodiments" are used repeatedly. The terms usually do not refer to the same embodiment, but they may refer to the same embodiment. The words such as "including", "having" and "comprising" are synonyms unless the context shows other meanings.

The above is only embodiments of the present application and is not intended to limit the present application in any form. Although the present application has been disclosed by the specific embodiments above, the embodiments are not intended to limit the present application. Any person skilled in the art may make some changes or modifications to implement equivalent embodiments with equivalent changes by using the technical content disclosed above without departing from the scope of the technical solution of the present application. Any simple modification, equivalent change and modification made to the foregoing embodiments according to the technical essence of the present application without departing from the content of the technical solution of the invention shall fall within the scope of the technical solution of the present application.

What is claimed is:

1. A shielded gate trench (SGT) semiconductor apparatus, comprising:
   a heavily N-type doped semiconductor substrate (100);
   an N-type epitaxial layer (110) formed on the semiconductor substrate (100);
   at least one trench structure (120) formed on the epitaxial layer (110) and accommodating at least one gate polysilicon layer (130), wherein the trench structure (120) comprises a shielding polysilicon layer (140) and an inter-polysilicon oxide layer (150) surrounding the shielding polysilicon layer (140), wherein the at least one gate polysilicon layer (130), the shielding polysilicon layer (140) and the inter-polysilicon oxide layer (150) are enclosed by the at least one trench structure (120);
   a P-type doped body junction region (160) formed on the N-type epitaxial layer (110);
   a P-type doped body (170) formed above the P-type body junction region (160);
   a source contact region (180) which connects the source region (184) and the P-type body region (170) through a heavily P-type doped contact region (182);
   a source region (184) formed above the P-type body (170);
   a source metal layer (186) formed on the source region (180);
   a first contact region (210) in which the source region (184) is in contact with the source metal layer (186),
   a second contact region (220) in which the shielding polysilicon layer (140) is in contact with the source metal layer (186),
   a third contact region (230) in which the gate polysilicon layer (130) is in contact with a gate metal layer (188), wherein the gate metal layer (188) surrounds the source metal layer (186);
   a trench region (240), in which a first trench in a vertical direction is connected to a second trench in a parallel direction by using the gate polysilicon layer (130);
   the source metal layer (186) and the gate metal layer (188) are formed on an active region, and a gate polysilicon contact region; and
   an LTO and a boron-phosphorosilicate glass (BPSG) oxide layers (190) enclosed by the source metal layer (186) are arranged between the semiconductor surface and a metal layer comprising the source metal layer (186) and the gate metal layer (188).

2. The SGT semiconductor apparatus according to claim 1, further comprising a gate polysilicon contact (260) which is arranged at an outer edge of an active region.

3. The SGT semiconductor apparatus according to claim 2, wherein the gate polysilicon layer (130) connected to the gate metal layer (188) is arranged outside one of the at least one trench structure (120).

4. The SGT semiconductor apparatus according to claim 2, wherein a gap between the shielding polysilicon layer (140) and the gate polysilicon layer (130) is greater than 0.1 µm.

5. The SGT semiconductor apparatus according to claim 2, wherein a gap is between the gate polysilicon layer (130) and the gate trench sidewall in the gate polysilicon contact region; a size of the gap when a device breakdown voltage BVdss is less than or equal to 30 V is 0.1 µm; and when the device breakdown voltage BVdss is greater than 30 V, the gap is large, such as 0.2 to 0.6 µm.

6. The SGT semiconductor apparatus according to claim 1, wherein the shielding polysilicon layer (140) is deposited on the semiconductor surface in one of the at least one trench structure (120), the active region is surrounded by one of the at least one trench structure (120), and the shielding polysilicon layer (140) connected to the source metal layer (186) can be made outside or inside the active region, or an intermediate region of an active region.

7. The SGT semiconductor apparatus according to claim 6, wherein a shielding polysilicon contact (250) located in a middle of the SGT semiconductor apparatus comprises the gate polysilicon layer (130) connected to and crossing a part of a shielding polysilicon contact region, so multiple shielding polysilicon contacts are arranged between the two gate metal bus lines to further reduce a resistance of the shielding polysilicon layer.

8. The method for manufacturing an SGT semiconductor apparatus according to claim 7, wherein a gap d1 between a shielding polysilicon layer (140) and an inter-polysilicon oxide layer (150) is determined by a gap between the shielding polysilicon layer (140) and a gate polysilicon layer (130); and
   a gap between the shielding polysilicon layer (140) and the gate polysilicon layer (130) is greater than 0.1 µm.

* * * * *